(12) United States Patent
Posthuma et al.

(10) Patent No.: US 12,002,680 B2
(45) Date of Patent: Jun. 4, 2024

(54) METHOD OF MANUFACTURING A III-N ENHANCEMENT MODE HEMT DEVICE

(71) Applicant: IMEC VZW, Leuven (BE)

(72) Inventors: Niels Posthuma, Elewijt (BE); Stefaan Decoutere, Haasrode (BE)

(73) Assignee: IMEC VZW, Leuven (BE)

( * ) Notice: Subject to any disclaimer, the term of this patent is extended or adjusted under 35 U.S.C. 154(b) by 316 days.

(21) Appl. No.: 17/345,229

(22) Filed: Jun. 11, 2021

(65) Prior Publication Data

US 2022/0181159 A1 Jun. 9, 2022

(30) Foreign Application Priority Data

Dec. 8, 2020 (EP) ..................................... 20212504

(51) Int. Cl.
*H01L 21/285* (2006.01)
*H01L 21/3213* (2006.01)
(Continued)

(52) U.S. Cl.
CPC .. *H01L 21/28581* (2013.01); *H01L 21/32134* (2013.01); *H01L 21/32135* (2013.01);
(Continued)

(58) Field of Classification Search
CPC ......... H01L 21/28581; H01L 21/32134; H01L 21/32135; H01L 29/2003; H01L 29/42316; H01L 29/66462; H01L 29/7786; H01L 29/1066; H01L 2924/12032; H01L 29/66143; H01L 29/66212;
(Continued)

(56) References Cited

U.S. PATENT DOCUMENTS 9,379,191 B2 6/2016 Hsu et al.
9,929,263 B2 3/2018 Sonsky et al.
(Continued)

FOREIGN PATENT DOCUMENTS

WO 2015/017511 A2 2/2015
WO 2015/017511 A3 2/2015

OTHER PUBLICATIONS

Extended European Search Report and Written Opinion, Application No. EP20212504.3, dated Jun. 1, 2021, 9 pages.
(Continued)

*Primary Examiner* — Cuong B Nguyen
(74) *Attorney, Agent, or Firm* — McDonnell Boehnen Hulbert & Berghoff LLP

(57) ABSTRACT

A method includes providing a semiconductor structure including: a substrate; a layer stack with each layer of the layer stack including a Group III-nitride material; and a p-type doped GaN layer on the layer stack. The method also includes providing, on the GaN layer, a metal bi-layer including a first metal layer in contact with GaN layer and a second metal layer on the first metal layer and having a lower sheet resistance than the first metal layer. The method also includes performing a patterning process upon the metal bi-layer and the p-type doped GaN layer such that a first periphery of the first metal layer is aligned to a second periphery of the second metal layer and such that a first cross section of the metal bi-layer is smaller than a second cross section of the GaN layer parallel to the first cross section.

14 Claims, 13 Drawing Sheets

(51) Int. Cl.
  *H01L 29/20* (2006.01)
  *H01L 29/423* (2006.01)
  *H01L 29/47* (2006.01)
  *H01L 29/66* (2006.01)
  *H01L 29/778* (2006.01)

(52) U.S. Cl.
  CPC .... *H01L 29/2003* (2013.01); *H01L 29/42316* (2013.01); *H01L 29/475* (2013.01); *H01L 29/66462* (2013.01); *H01L 29/7786* (2013.01)

(58) Field of Classification Search
  CPC ..... H01L 29/872–8725; H01L 27/0766; H01L 29/6603; H01L 29/6606; H01L 21/0435; H01L 21/0495; H01L 21/28537; H01L 21/21581; H01L 29/0891; H01L 29/47–475; H01L 29/66643; H01L 29/66848–66886; H01L 29/7839; H01L 29/806; H01L 29/812–8128; H01L 31/1121–1123; H01L 33/0033; H10K 51/0579
  See application file for complete search history.

(56) References Cited

U.S. PATENT DOCUMENTS

| | | | |
|---|---|---|---|
| 10,607,840 | B2 | 3/2020 | Harada et al. |
| 10,833,159 | B1 | 11/2020 | Hao et al. |
| 2010/0258843 | A1 | 10/2010 | Lidow et al. |
| 2013/0075752 | A1 | 3/2013 | Kotani |
| 2016/0049347 | A1 | 2/2016 | Negoro et al. |
| 2018/0240753 | A1* | 8/2018 | LaRoche ........... H01L 21/28575 |
| 2020/0365699 | A1 | 11/2020 | Chang et al. |
| 2021/0399123 | A1* | 12/2021 | Liao .................... H01L 29/7786 |

OTHER PUBLICATIONS

Posthuma, N. E., S. You, S. Stoffels, H. Liang, M. Zhao, and S. Decoutere. "Gate architecture design for enhancement mode p-GaN gate HEMTs for 200 and 650V applications." In 2018 IEEE 30th International Symposium on Power Semiconductor Devices and ICs (ISPSD), pp. 188-191. IEEE, 2018.

Hwang, Injun, Jongseob Kim, Hyuk Soon Choi, Hyoji Choi, Jaewon Lee, Kyung Yeon Kim, Jong-Bong Park et al. "p-GaN gate HEMTs with tungsten gate metal for high threshold voltage and low gate current." IEEE Electron Device Letters 34, No. 2 (2013): 202-204.

* cited by examiner

METHOD OF MANUFACTURING A III-N ENHANCEMENT MODE HEMT DEVICE

CROSS-REFERENCE TO RELATED APPLICATIONS

The present application is a non-provisional patent application claiming priority to European Patent Application No 20212504.3, filed on Dec. 8, 2020, the contents of which are hereby incorporated by reference.

FIELD OF THE DISCLOSURE

The present disclosure relates to a method of manufacturing a III-N enhancement mode HEMT device and to an intermediate semiconductor structure made thereby.

BACKGROUND

In the field of enhancement mode low voltage p-GaN Schottky gate HEMT devices, it is important to make the devices compact for optimal performance (i.e. specific $R_{on, sp}$), switching speed, and cost. The size of the devices is scaled down by reducing several parameters. One of them is the gate length $L_g$. Besides scaling the gate length, furthermore, the gate architecture of choice for these devices is the stacked gate patterning approach (1-mask). In this method the gate is defined by patterning the p-GaN layer and the gate metal in one patterning step. For higher voltage applications, however, the separate gate patterning approach (3-mask) is applied, where a thick gate metal stack is used, forming a gate metal field plate from the gate towards the drain of the device. This separate gate patterning approach with an additional field plate can limit the potential of the gate length $L_g$ scaling, limiting the possibilities for area scaling of the device. In the stacked gate patterning approach, the gate metal consists of a single metal layer with limited thickness (e.g., 100 nm), using a metal that forms a Schottky junction on top of the p-GaN. In this approach, $L_g$ can be scaled down to 0.5 µm.

In the stacked gate patterning approach for p-GaN HEMTs, the gate resistance can be largely impacted by the sheet resistance of the metal. While the choice of a suitable metal can address this issue, it should be kept in mind that the threshold voltage ($V_t$) and on-state gate leakage current ($I_{g-on}$) generally should not be challenged by the choice of this metal as lowered threshold voltage and increased on-state gate leakage current are not usually desirable device characteristics. Furthermore, the reliability of the gate generally should also be maintained by the choice of this gate metal.

There is, therefore, a need in the art for methods to manufacture III-N enhancement mode (e-mode) HEMT devices enabled by the choice of a gate metal that can help overcome such challenges.

SUMMARY

The present disclosure includes methods for manufacturing e-mode HEMT devices. In some examples, a reduced total gate metal resistance can be achieved while maintaining the device performance to allow for gate length scaling.

In a first aspect, the present disclosure relates to a method for manufacturing a III-N enhancement mode HEMT device, the method comprising:
providing a semiconductor structure comprising:
a substrate,
a layer stack having a surface overlying the substrate, wherein each layer of the layer stack comprises a Group III-nitride material,
a p-type doped GaN layer on the surface,
providing, on the p-type doped GaN layer, a metal layer, thereby forming a Schottky junction with the p-type doped GaN layer, the metal layer being a bi-layer consisting of a first metal layer being in contact with the p-type doped GaN layer and being sandwiched between the p-type doped GaN layer and a second metal layer having a lower sheet resistance than the first metal layer,
performing a patterning process, thereby forming a patterned bi-layer having a first horizontal cross section and a patterned p-type doped GaN layer having a second horizontal cross section, wherein a periphery of the patterned first metal layer is aligned to a periphery of the patterned second metal layer and wherein the second horizontal cross section has a larger area than the first horizontal cross section.

It is a potential advantage of embodiments of the first aspect that they can allow for obtaining lower total gate metal resistance, while the device performance in terms of threshold voltage ($V_t$) and gate current in on-state ($I_{g-on}$), where ($V_{gs} > V_t$), is maintained, wherein $V_{gs}$ is the gate to source voltage.

It is a potential advantage of embodiments of the first aspect that they can allow for easy integration of the manufacturing steps.

It is a potential advantage of embodiments of the first aspect that they can allow for manufacturing a III-N enhancement mode HEMT device for low voltage applications and p-GaN HEMT devices integrated into GaN-integrated circuits (ICs).

It is a potential advantage of embodiments of the first aspect that they can allow for manufacturing a III-N enhancement mode HEMT device with good gate reliability.

In a second aspect, the present disclosure relates to an intermediate semiconductor structure for the manufacturing of a III-N enhancement mode HEMT device, the intermediate semiconductor structure comprising:
a substrate,
a layer stack, having a surface overlying the substrate, wherein each layer of the layer stack comprises a Group III-nitride material,
a patterned p-type doped GaN layer, on the surface, having a second horizontal cross section,
a patterned metal bi-layer, on the patterned p-type doped GaN layer, for forming a Schottky junction, the patterned metal bi-layer having a first horizontal cross section and consisting of a first patterned metal layer being in contact with the patterned p-type doped GaN layer and being sandwiched between the patterned p-type doped GaN layer and a second patterned metal layer having a lower sheet resistance than the first patterned metal layer,
wherein a periphery of the first patterned metal layer is aligned to a periphery of the second patterned metal layer and wherein the second horizontal cross section has a larger area than the first horizontal cross section.

It is a potential advantage of embodiments of the second aspect that they can allow for obtaining a III-N enhancement mode HEMT device with reduced total gate metal resistance while the device performance in terms of threshold voltage ($V_t$) and gate current in on-state ($I_{g-on}$), where ($V_{gs} > V_t$), is maintained.

It is a potential advantage of embodiments of the second aspect that they can allow for easiness in the manufacturing of a III-N enhancement mode HEMT device.

It is a potential advantage of embodiments of the second aspect that they can allow for manufacturing a III-N enhancement mode HEMT device for low voltage applications and p-GaN HEMT devices integrated into GaN-integrated circuits (ICs).

Aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
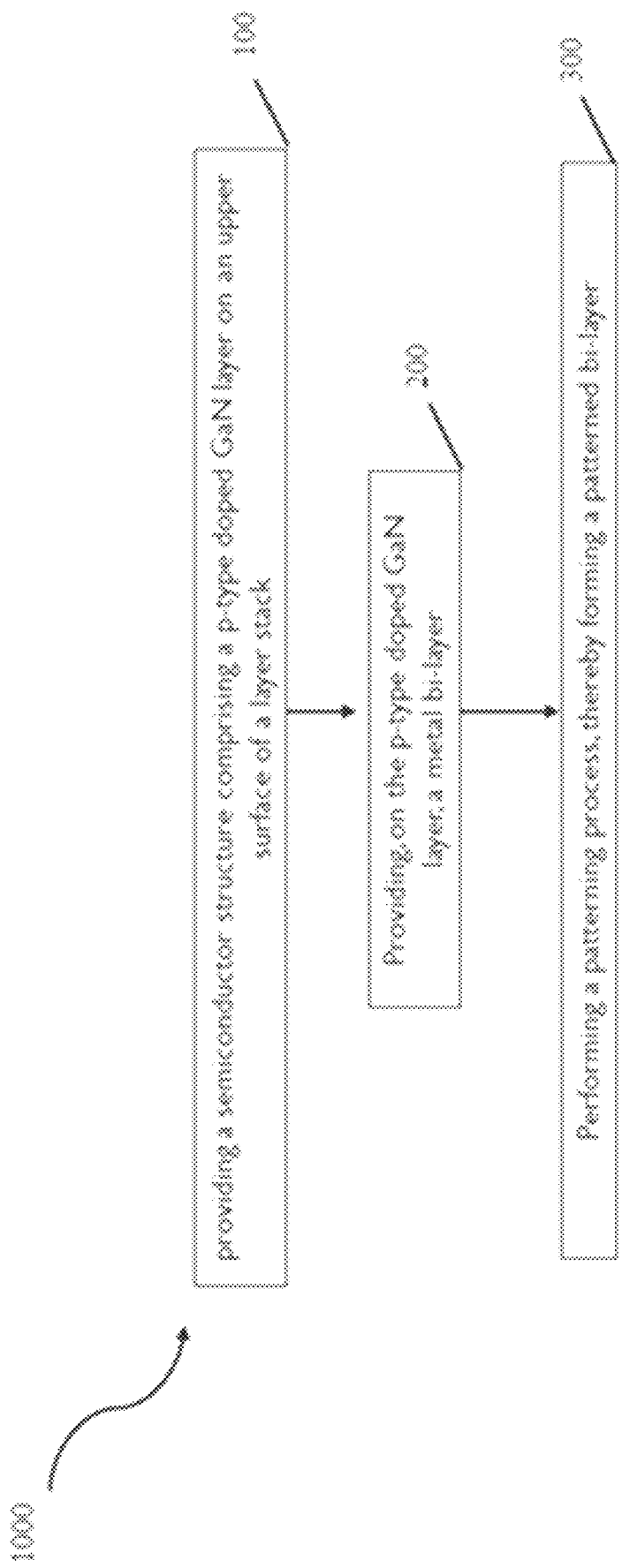
FIG. 1 is a block diagram of a method, according to an example.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some, but not other features included in other embodiments, combinations of features of different embodiments are meant to be within the scope of the disclosure, and form different embodiments, as would be understood by those in the art. For example, in the following claims, any of the claimed embodiments can be used in any combination.

Features from the dependent claims may be combined with features of the independent claims and with features of other dependent claims as appropriate and not merely as explicitly set out in the claims.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein, and unless provided otherwise, the term "wafer bow" refers to a deviation of the center point of the median surface of a free, unclamped wafer from the median surface reference plane established by three points equally spaced on a circle with a diameter a specified amount less than the nominal diameter of the wafer.

The disclosure will now be described by a detailed description of several embodiments of the disclosure. It is clear that other embodiments of the disclosure can be configured according to the knowledge of the persons skilled in the art without departing from the technical teaching of the disclosure, the disclosure being limited only by the terms appended in the claims.

We now refer to FIG. 1 showing a flowchart representing a method (1000) according to a first aspect of the present disclosure and FIGS. 3-7 showing schematic representation of the process steps, e.g., in sequential order, as used in embodiments of the first aspect of the present disclosure.

Figure 3:
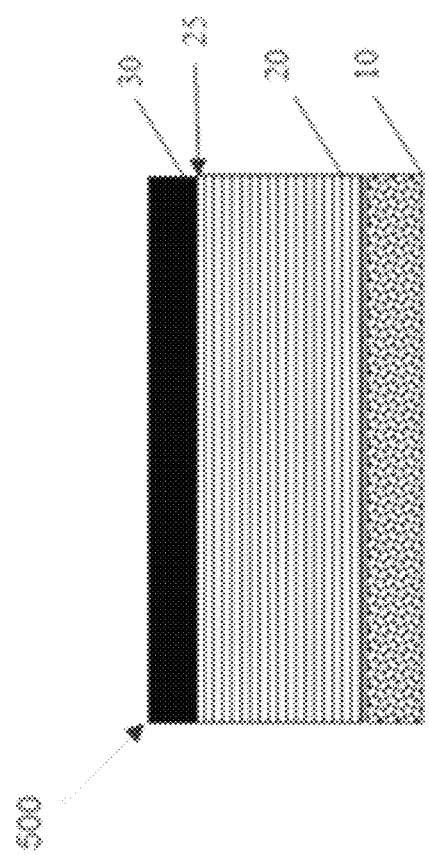
FIG. 3 shows a manufacturing process, according to an example.
Figure 6:
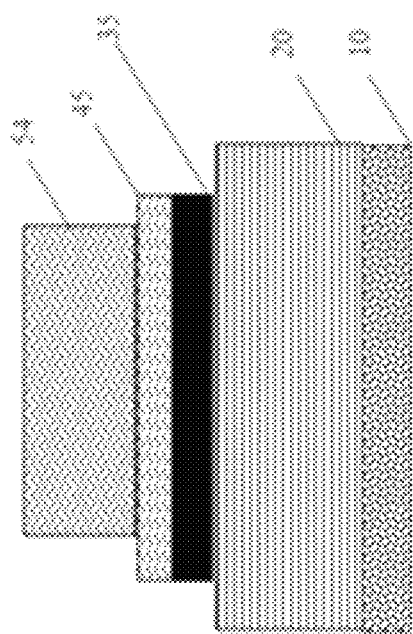
FIG. 6 shows a manufacturing process, according to an example.

The method (1000) comprises providing a semiconductor structure (500) (FIG. 3). This semiconductor structure comprises a substrate (10), a layer stack (20) having a surface (25), and a p-type doped GaN layer (30) on the surface (25). This layer stack (20) overlies the substrate (10), wherein each layer of the layer stack (20) comprises a Group III-N material. In embodiments, each layer of this layer stack (20) comprising the Group III-N material may be different from one another. In embodiments, this Group III-N material may be $Al_xGa_{1-x}N$, where $0 \leq x \leq 1$. For values of x that lie between zero and one and for values where x=0, the respective layers may be doped with carbon. Having a certain level of carbon in a specific part of the epitaxial stack has the potential advantage of improving the breakdown voltage.

This layer stack may, in embodiments, be on the substrate (10). This layer stack (20) may, in embodiments, comprise a layer of AlN in order to facilitate the nucleation of the further Group III-N layers on the substrate (10). On such a nucleation layer, a buffer layer may be provided, which overlies the substrate (10). A channel layer may be provided on the buffer layer, which may then be topped up on the channel layer, with a barrier layer (not shown in the figures) as known to persons skilled in the art. Thus, the surface (25) of the layer stack (20) may, in embodiments, be comprised in the barrier layer and thus be the surface of the barrier layer.

In embodiments, this semiconductor substrate (10) may comprise a monocrystalline silicon layer. This monocrystalline silicon layer may be a Si (111) or a Si (100) layer.

Figure 4:
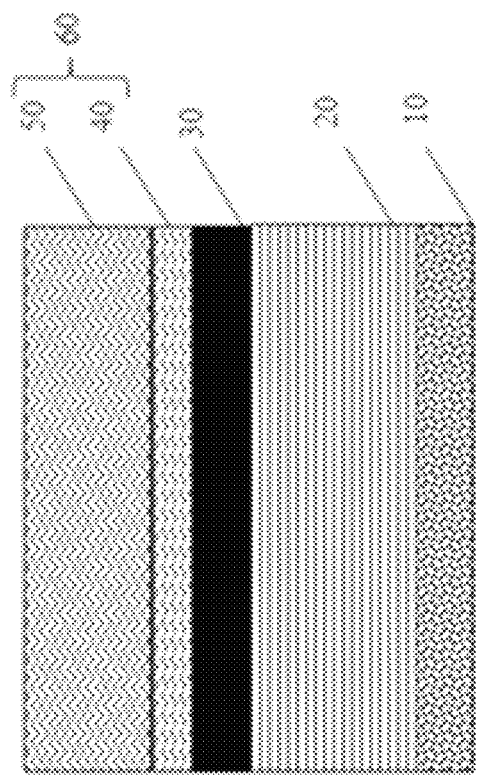
FIG. 4 shows a manufacturing process, according to an example.

On the p-type doped GaN layer (30), a metal layer (60) is provided (200) (FIG. 4). This metal layer (60) forms a Schottky junction with the p-type doped GaN layer. This metal layer (60) is a bi-layer consisting of a first metal layer (40) which is in contact with the p-type doped GaN layer (30) and which is sandwiched between the p-type doped GaN layer (30) and a second metal layer (50). This second metal layer (50) has a lower sheet resistance than the first metal layer (40). The fact that the second metal (50) has a lower sheet resistance is potentially advantageous since it helps to lower the sheet resistance of the gate metal. However, the choice of this second metal (50) also can allow for easier patterning of the gate metal.

Figure 7:
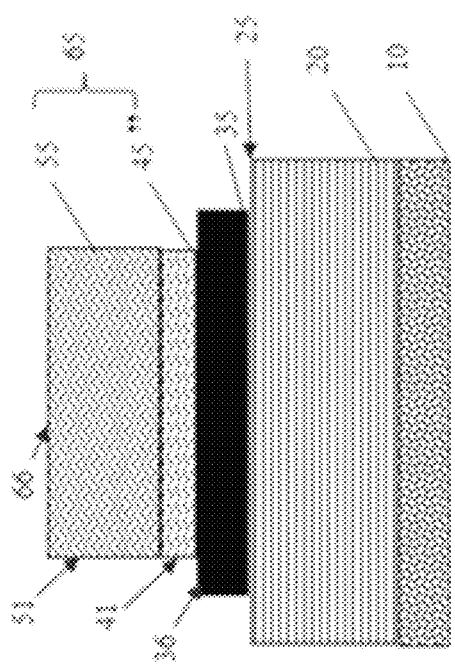
FIG. 7 shows a manufacturing process, according to an example.

A patterning process is performed (300), as a result of which a patterned bi-layer (65) and a patterned p-type doped GaN layer (35) is obtained (see FIG. 7). In embodiments, this patterning process may comprise at least one lithography process and at least one etching process. Since the bi-layer consists of the first metal layer (40) and the second metal layer (50), after the patterning process, a patterned first metal layer (45") and a patterned second metal layer (55) is formed. This patterned bi-layer (65) has a first horizontal cross section (66) and the patterned p-type doped GaN layer (35) has a second horizontal cross section (36) and the second horizontal cross section (36) has a larger area than the first horizontal cross section (66). This is potentially advantageous because it can allow for obtaining good gate reliability. Gate reliability refers to the capability of the gate to handle a certain gate voltage. One of the tests done for this is the High Temperature Gate Bias test, where the gate is subjected to $V_{gs}$ such as for example at 7 V, for 10 ksec at 150° C. If the test is passed and the device does not break nor show a big shift in the current-voltage (I-V) characteristics, the gate is considered reliable. A second way to test the gate reliability is to stress the gate at even higher voltages and test how long it takes to break the gate (Time To Failure). When measuring at different gate voltages an extrapolation can be done to find at which voltage the gate can be operated for a duration of 10 years with a certain failure percentage.

The periphery (41) of the patterned first metal layer (45") is aligned to the periphery (51) of the patterned second metal layer (55) (FIG. 7). This is potentially advantageous because it can make the deposition of further layers easier after the gate metal is patterned and thus potentially leading to the absence of gaps and voids in such layers, thus, making it also beneficial for obtaining good gate reliability.

The inventors have found out that the method offers the potential advantage of maintaining device performance in terms of threshold voltage ($V_t$) and gate current in on-state ($I_{g-on}$), where ($V_{gs} > V_t$), is maintained, while potentially benefiting from a reduced total gate metal resistance. This then can allow for gate length scaling without compromising with the total gate metal resistance or device performance and thus enabling area scaling of the device.

This is supported by $I_dV_{gs}$ curves and $I_gV_{gs}$ curves in FIGS. 8-15, where $I_d$ represents drain current and $V_{gs}$ represents gate to source voltage and where $I_g$ represents gate current.

Figure 8:
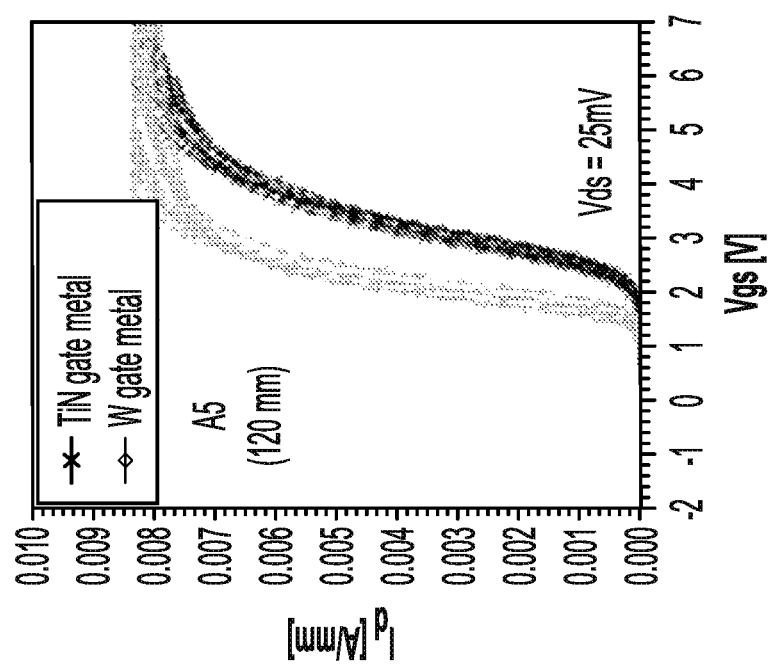
FIG. 8 shows device performance characteristics, according to an example.
Figure 11:
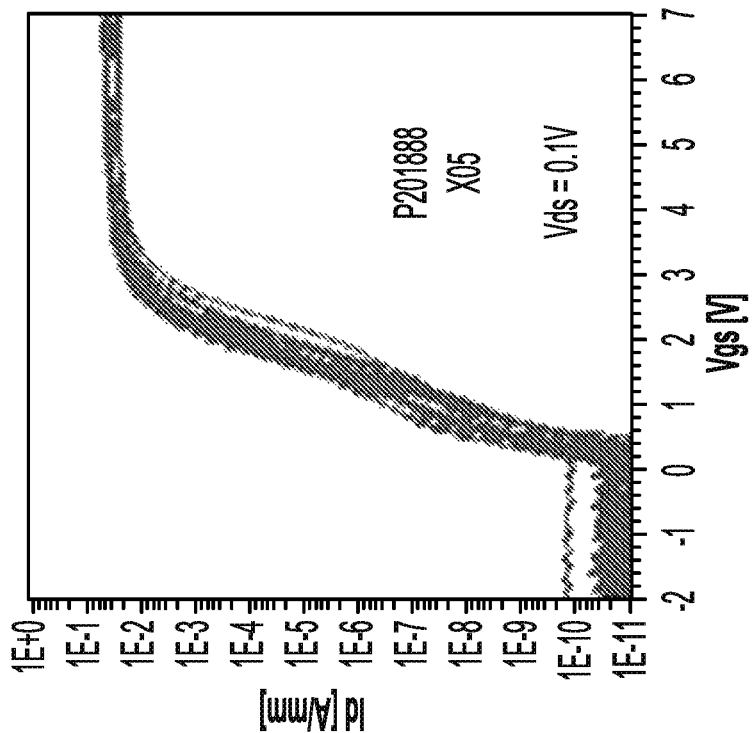
FIG. 11 shows device performance characteristics, according to an example.
Figure 10:
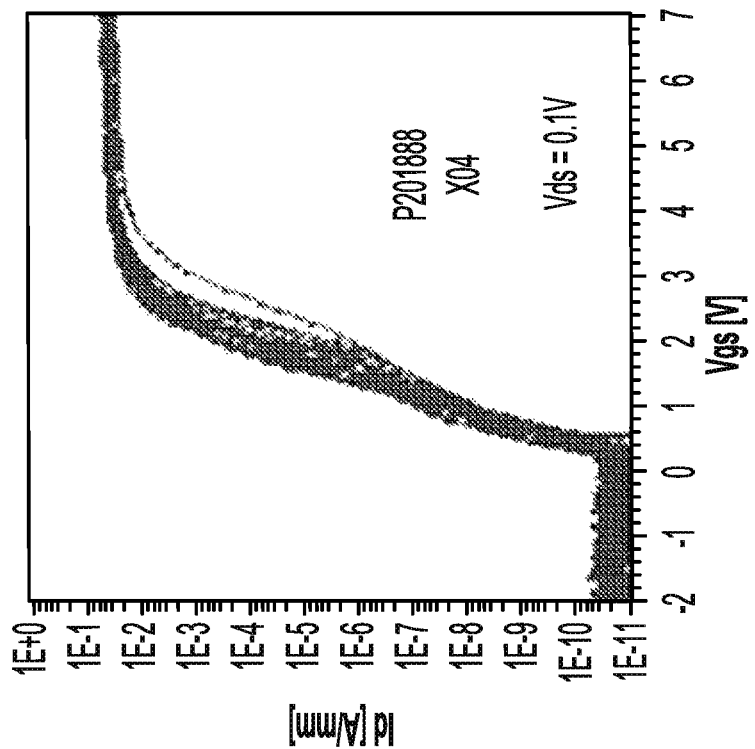
FIG. 10 shows device performance characteristics, according to an example.
Figure 12:
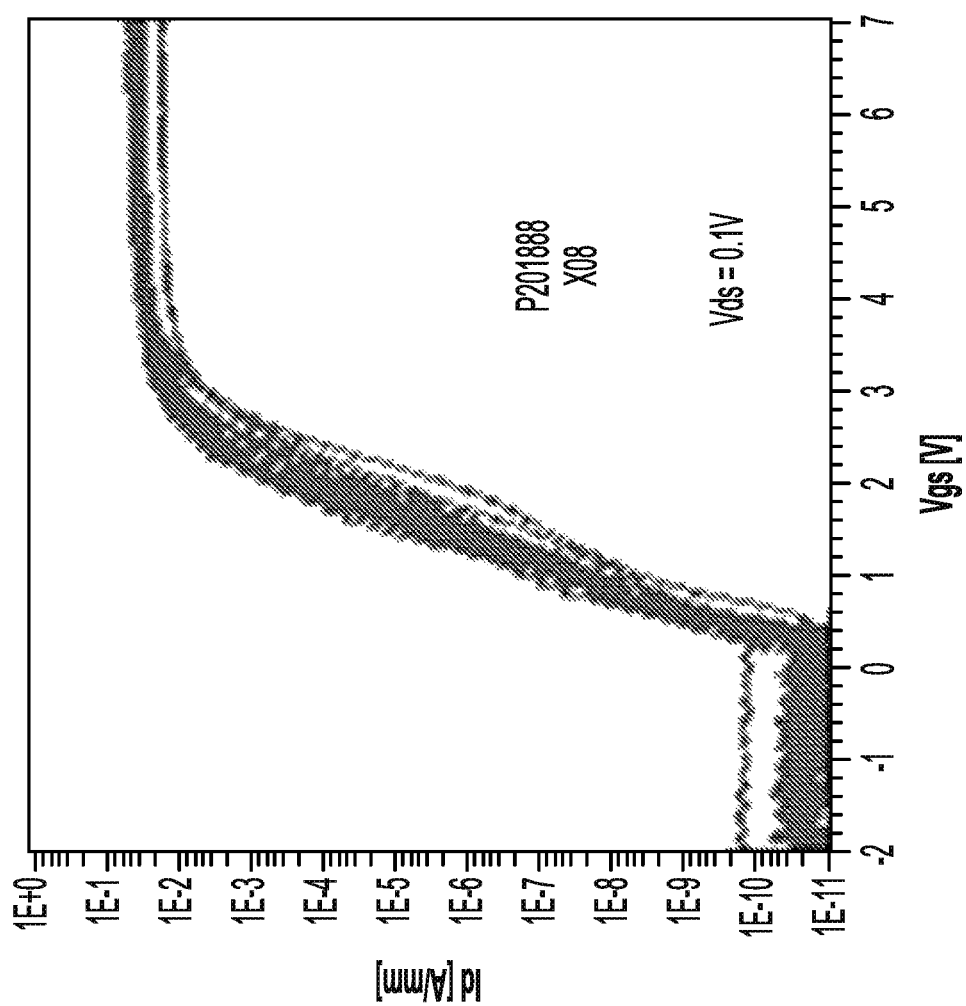
FIG. 12 shows device performance characteristics, according to an example.

FIG. 8 shows the difference in threshold voltage $V_t$ comparing a 100 nm TiN gate metal with a 100 nm W gate metal. This figure points out that the threshold voltage ($V_t$) is lower for W compared to TiN. Lower $V_t$ is generally not desired for enhancement mode HEMTs.

Figure 9:
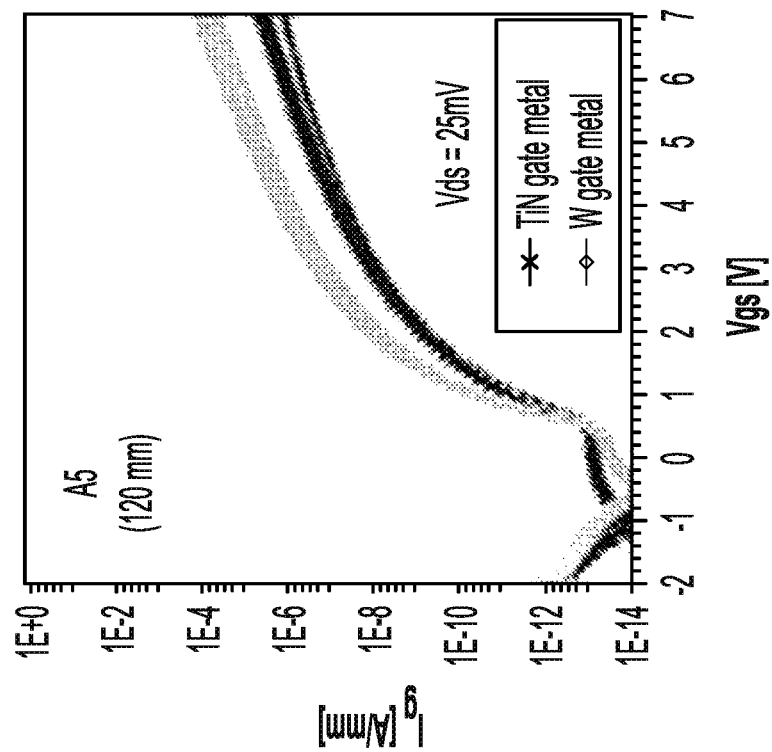
FIG. 9 shows device performance characteristics, according to an example.

FIG. 9 shows the difference in gate leakage current comparing 100 nm TiN gate metal with 100 nm W gate metal. This figure points out that the gate leakage current is higher for W compared to TiN. Higher gate leakage current is generally not desired.

On the other hand, returning to FIGS. 10-12, $I_dV_{gs}$ curves show a similar threshold voltage $V_t$ when comparing 100 nm TiN gate metal (FIG. 10) with the bi-layer consisting of either 5 nm TiN+100 nm W gate metal (FIG. 11) or 3 nm TiN+100 nm W gate metal (FIG. 12). The bi-layer results in a similar $V_t$ as for a single layer of TiN and offers the potential advantage of the lower W metal sheet resistance, generally important to obtain a low gate resistance.

Figure 14:
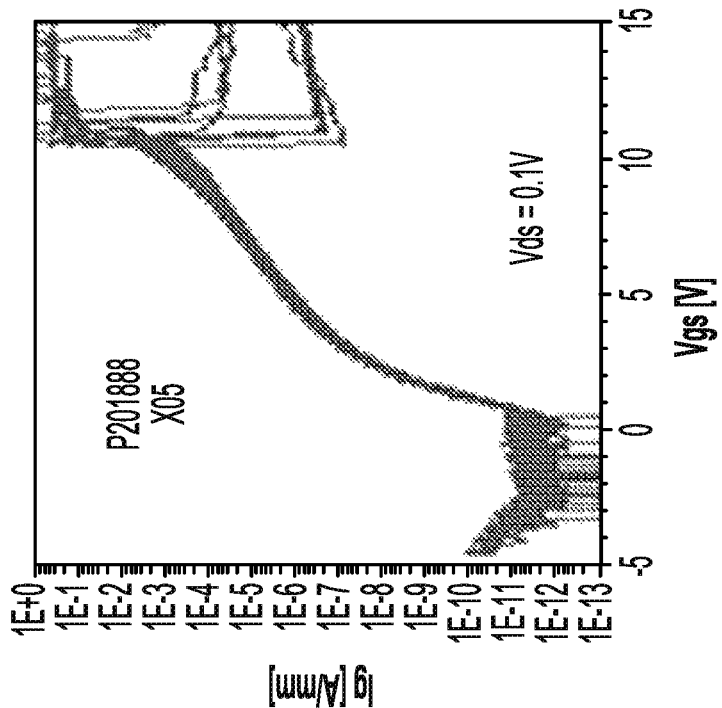
FIG. 14 shows device performance characteristics, according to an example.
Figure 13:
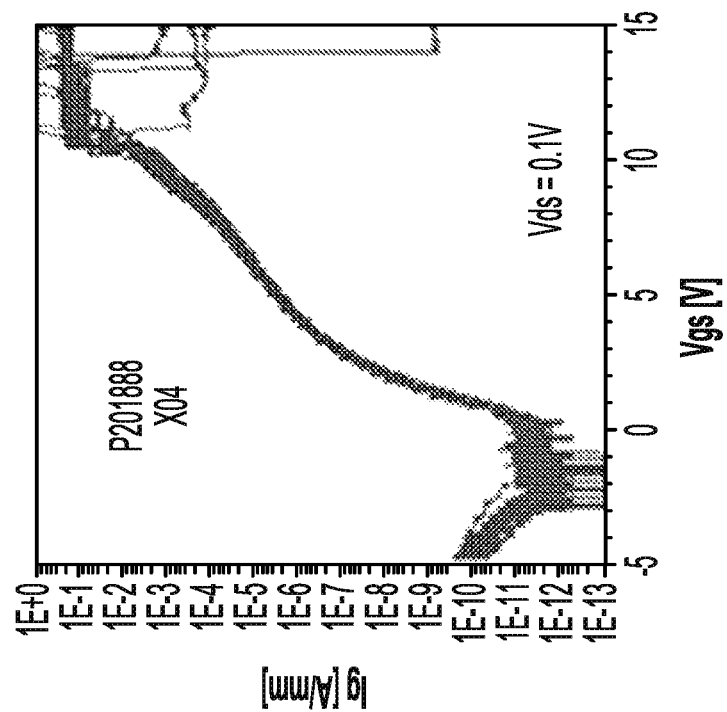
FIG. 13 shows device performance characteristics, according to an example.
Figure 15:
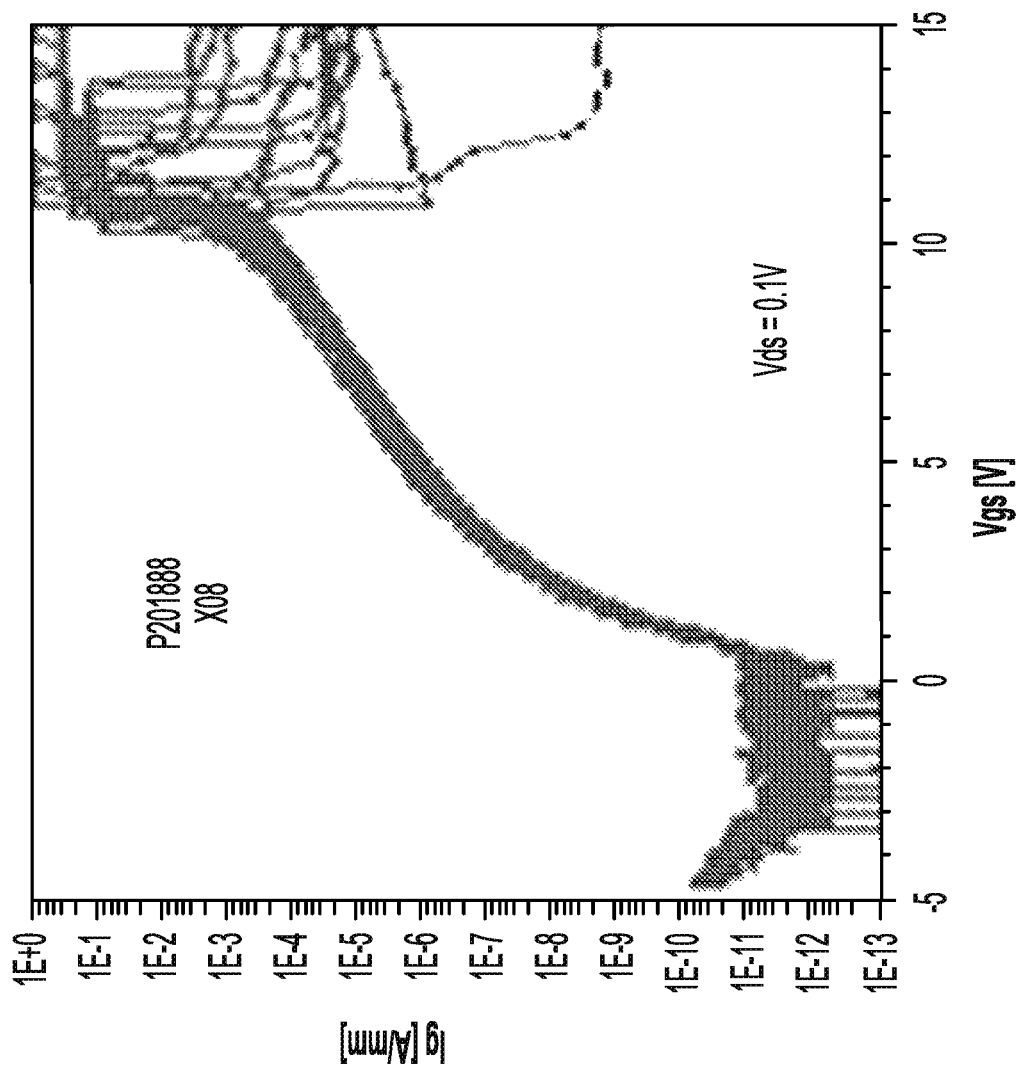
FIG. 15 shows device performance characteristics, according to an example.

FIGS. 13-15 shows that $IgV_{gs}$ curves show similar gate leakage characteristics when comparing 100 nm TiN gate metal (FIG. 13) with the bi-layer consisting of either 5 nm TiN+100 nm W gate metal (FIG. 14) or 3 nm TiN+100 nm W gate metal (FIG. 15). This figure points out that the bi-layer concept results in a similar gate leakage behavior as for a single layer of TiN and offers the potential advantage of the lower W metal sheet resistance, generally important to obtain a low gate resistance.

Figure 16:
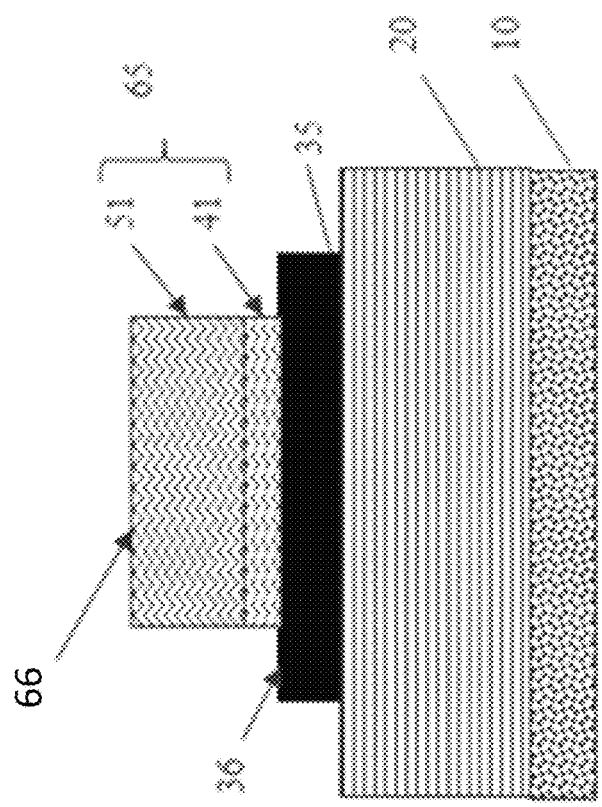
FIG. 16 shows an intermediate semiconductor structure, according to an example.
Figure 17:
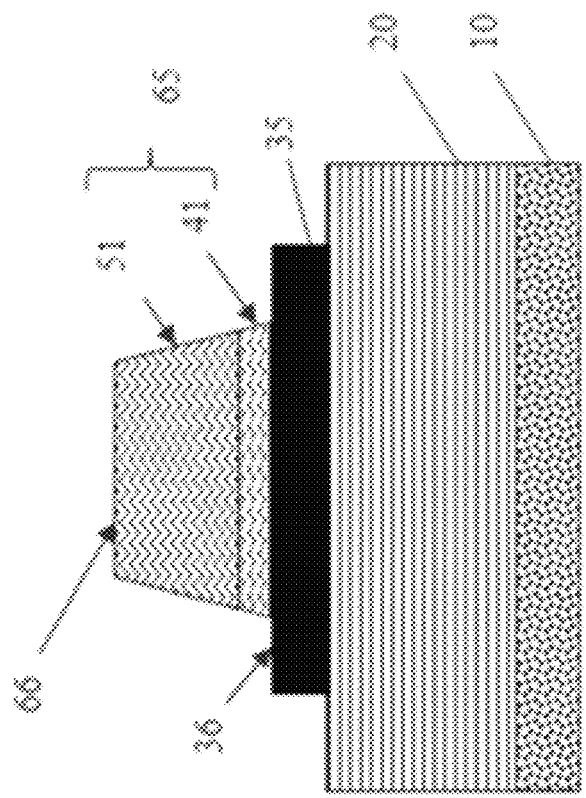
FIG. 17 shows an intermediate semiconductor structure, according to an example.

In embodiments, the alignment of the peripheries may be accomplished in alternative ways such as for instance shown in FIG. 16 and FIG. 17.

In embodiments, the first horizontal cross section (66) may substantially be the same at every position between the patterned p-type doped GaN layer (35) to a surface of the patterned bi-layer (65) (FIG. 16). This infers that the patterning process (300) is configured such that a surface topography is not created between the patterned first metal layer (45) and the patterned second metal layer (55) so that the patterned bi-layer (65) presents itself as a single patterned feature. This has the potential advantage that not only the provision of further layers on the semiconductor structure (500) is made easier but also the presence of the second metal layer (50) can result in a decrease in the total gate resistance since the horizontal cross section is kept the same.

In alternative embodiments, the first cross section (66) may decrease at positions moving away from the patterned p-type doped GaN layer (35) to a surface of the patterned bi-layer (65) (FIG. 17). As long as the periphery (41) of the patterned first metal layer (45") is aligned to the periphery (51) of the patterned second metal layer (55), this configuration also has the potential advantage that the deposition of further layers is made easier after the gate metal is patterned and as such thus, leads to the absence of gaps and voids in such layers; thus, potentially making it also beneficial for obtaining good gate reliability. The decrease in the horizontal first cross section (66) in these alternative embodiments may be configured such that an angle in the range of zero to 30 degrees would be maintained with respect to the sidewall of the patterned p-type doped GaN layer (35). This angle may, in embodiments, be 20 degrees. This is due to the fact that an uncontrolled decrease in the horizontal first cross section (66) at positions moving away from the patterned p-type doped GaN layer (35) to a surface of the patterned bi-layer (65) compared to the horizontal second cross section (36), eventually diminishes the benefit of the presence of the patterned second metal layer (55) on the reduction of the total gate metal resistance.

In embodiments, the thickness of the second metal layer (50) may be in the range of 50 nm to 500 nm. This offers the potential advantage that a reduced total gate metal resistance is obtained. This has to do with the reduction in the total gate metal sheet resistance offered by this second metal layer (50) in this thickness range. Thickness values greater than 500 nm can pose challenges on the process regarding the deposition of further layers on the semiconductor structure. Furthermore, on wafer level manufacturing, thickness values higher than 500 nm can lead to wafer bow, which is detrimental for the reliability of the devices being manufactured. If the wafer bow is larger than ±50 μm, further processing of these wafers can become problematic due to limitations of the processing tools, for example lithography tools where the pattern of a mask needs to be transferred to the wafer with good depth of focus. Wafer bow measurements have been performed using a commercial tool Sem-Dex 301 from company ISIS Sentronics Metrology GmbH.

On the other hand, thickness values lower than 50 nm can result in an undesirable increase in total gate metal sheet resistance since sheet resistance is inversely proportional to thickness. As such, it will typically lead to an undesirable total gate metal resistance increase.

In embodiments, the thickness of the second metal layer may be in the range of 80 nm to 120 nm.

In embodiments, the first metal layer (40) may be any metal that forms a Schottky contact with the p-type doped GaN layer. In a CMOS compatible manufacturing environment, this first metal layer (40) may thus be for instance W or TiN. In this respect, TiN may be an alternative that can be chosen for this purpose. This is due to the fact that W generally leads to lower threshold voltage and higher gate leakage current, which is undesirable as shown in FIG. 8 and FIG. 9.

The second metal layer (50), on the other hand, may be any metal that has lower sheet resistance than the first metal layer (40), such as for example tungsten (W) or aluminum (Al). In this respect, while Al could also offer the potential advantage of providing reduced total gate metal resistance, W is potentially more advantageous as the second metal layer. This is because W and TiN are rather similar metals in terms of their etch characteristics thus, making the patterning process of the bi-layer more manageable, while offering at the same time the potential advantage that reduced total gate resistance can be achieved. Furthermore, the use of W, as the second metal is potentially advantageous because it is easily managed in terms of the patterning process that is required to form the patterned bi-layer (65) in addition to having a lower sheet resistance than TiN.

Thus, in embodiments, the first metal layer (40) may be titanium nitride (TiN), and the second metal layer (50) may be tungsten (W). The combination of W with TiN to form the bilayer has the potential advantage that patterning of the bilayer becomes easier due to the similar etch characteristics of W and TiN and also the fact that the sheet resistance of W is a factor 3 to 4 lower than that of the TiN, thus resulting in a lower contribution of the gate metal layer to the total gate metal resistance. The fact that the device characteristics are at the same time maintained offers to this combination a further potential advantage, which opens the route to gate length scaling and thus, to area scaling of the device.

In alternative embodiments, while the first metal layer (40) may be tantalum nitride (TaN), the second metal layer (50) may be tungsten (W). Choice of TaN offers also the potential advantage that it creates a Schottky junction with the p-type doped GaN layer (30). To create a good Schottky junction on p-GaN, a lower work function is beneficial for obtaining higher gate threshold voltage and lower gate leakage current. Depending on the deposition method, the layer thickness, anneal temperature, and the capping layer, the work function of TaN can thus be tuned. Therefore, by configuring these process parameters such that a similar work function value can be obtained for TaN as that of TiN, TaN can be a potential candidate for the first metal layer (40). In these embodiments, TaN may be provided at a thickness of 1 nm to 2 nm.

In still alternative embodiments, while the first metal layer (40) may be a bilayer, the second metal layer (50) may be tungsten (W). This bilayer, in these embodiments, may be a bilayer of TiN/TaN. In these embodiments, TaN may be provided in contact with the p-type doped GaN layer (30). In these embodiments, TaN may be provided at a thickness of 1 nm to 2 nm. TiN may, for instance, be provided at a thickness of 3 nm to 5 nm.

Figure 2:
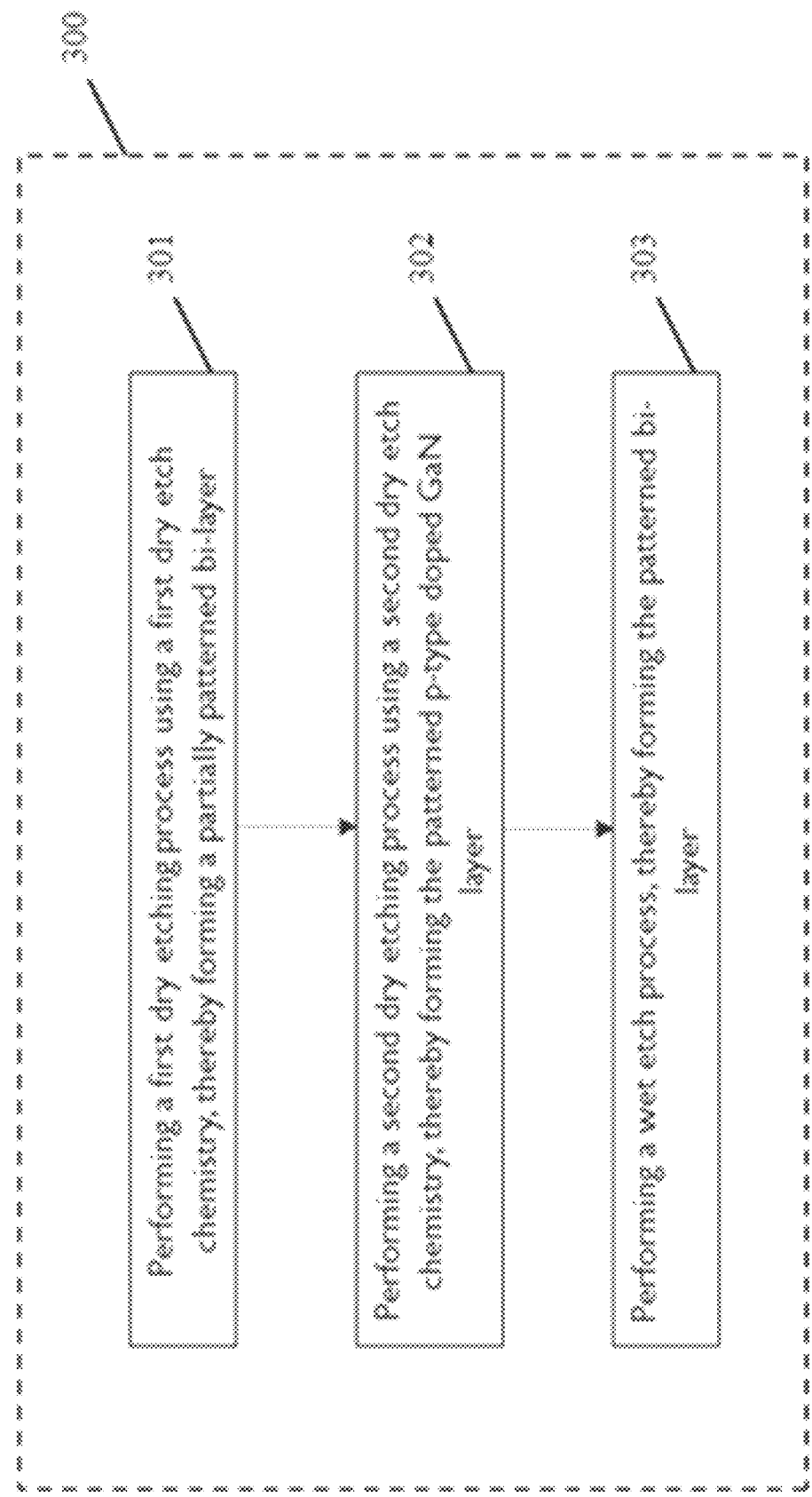
FIG. 2 is a block diagram of a method, according to an example.

We now refer to FIG. 2 showing a flowchart representing the patterning process comprised in the method of the present disclosure according to the first aspect and continuing to refer to FIGS. 3-7.

In embodiments, this patterning process may comprise at least one lithography process and at least one etching process. The at least one lithography process is performed as known to persons skilled in the art. A hard mask is used, such as for instance, silicon nitride to protect the exposed features after the at least one lithography process and before performing the etch processes.

Figure 5:
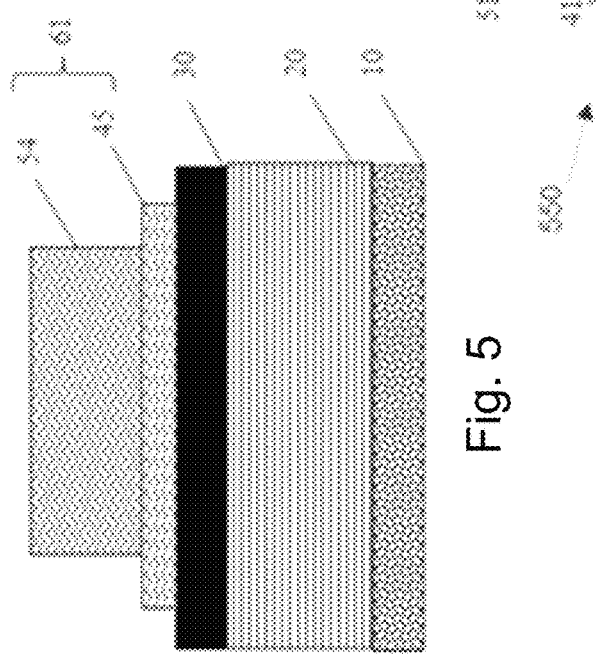
FIG. 5 shows a manufacturing process, according to an example.

In embodiments, performing the patterning process (300) may comprise performing a first dry etching process using a first dry etch chemistry (301) (FIG. 2). As a result of this first dry etching process, a partially patterned bi-layer (61) is formed (FIG. 5). This partially patterned bi-layer (61) refers to the fact that the first metal layer and the second metal layer is etched to some extent (45; 54), but not completely to obtain the desired patterned profile. During this first dry etching process, the etch rate of the second metal layer (50) is higher than the etch rate of the first metal layer (40) indicating that the second metal layer (50) is etched faster than the first metal layer (40).

In embodiments, where the first metal layer (40) is titanium nitride (TiN) and the second metal layer (50) is tungsten (W), this first dry etch chemistry may be a mixture of $CHF_3/SF_6$. A hard mask layer, for example, silicon nitride may be used. The silicon nitride hard mask, second metal layer (50) and first metal layer (40) are etched stopping on the p-type doped GaN layer (30). The etch selectivity of the second metal layer (50) with respect to the first metal layer (40) being greater than 1 has the potential advantage that the first metal layer (40) is etched to a lesser extent than the second metal layer (50) during this first dry etching process (301). Since the first metal layer (40) is provided at a much lower thickness than that of the second metal layer (50), this presented etch selectivity during this first dry etching process is potentially advantageous such that the first metal layer (40) is not overly etched. In experiments where a 100 nm W is provided on 5 nm TiN, it has been observed that W showed a lateral etching of about 40 nm to 50 nm, while TiN showed minimal etching.

The patterning process (300), may further comprise a second dry etching process (302) (FIG. 2) using a second dry etch chemistry, which is different from the first dry etch chemistry. A patterned p-type doped GaN layer (35) (FIG. 6) is formed as a result of this second dry etching process (302).

Figure 18:
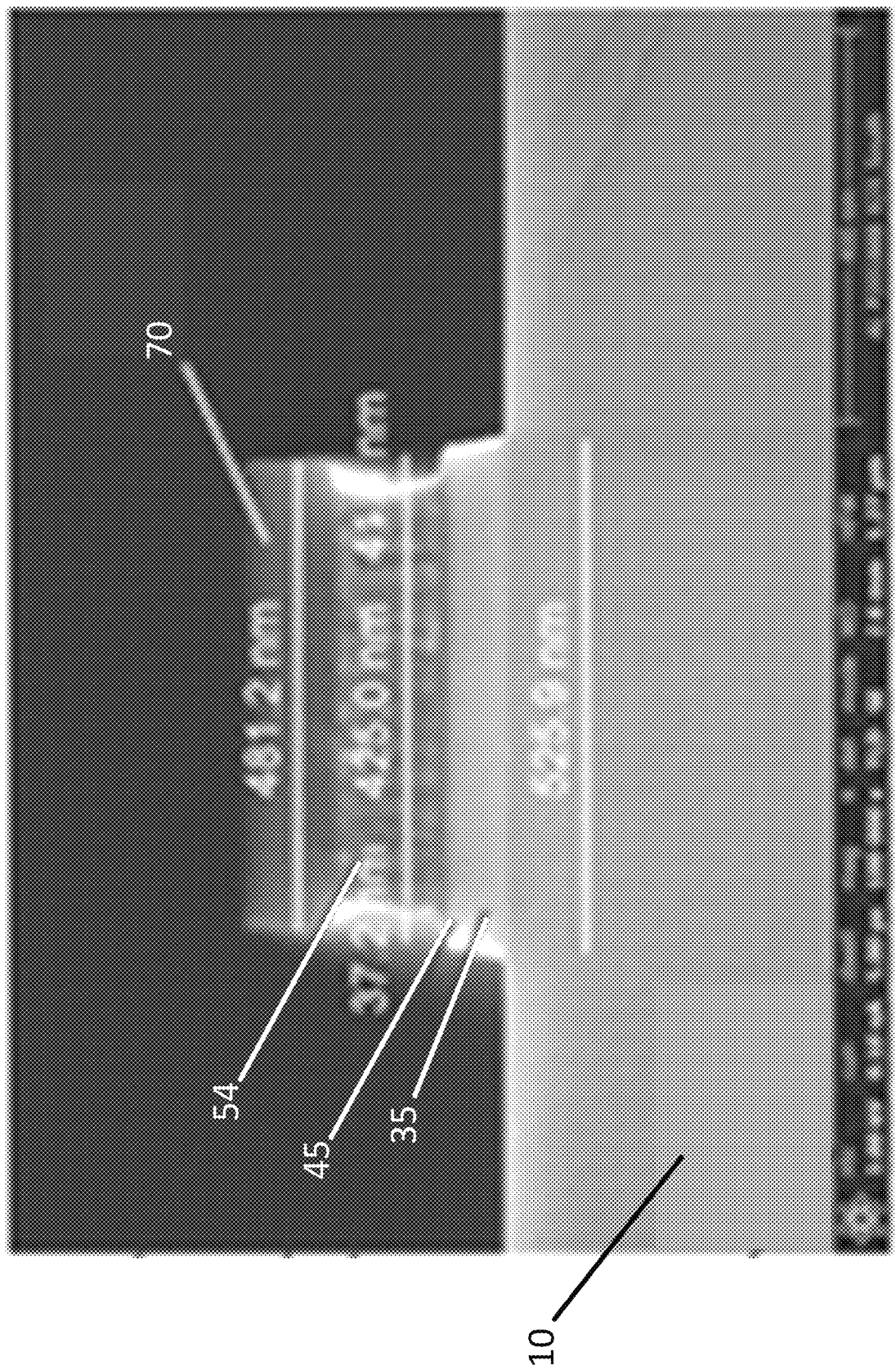
FIG. 18 is a cross sectional scanning electron microscopy (X-SEM) image of a semiconductor structure, according to an example.

FIG. 18 shows a cross-section SEM image of the semiconductor structure (500) after completion of the first (301) and second dry etching processes (302), where the p-type doped GaN layer is patterned (35). The bi-layer is still partially patterned as it was after completion of the first dry etching process (301) since this second dry etching process (302) is specific for patterning the p-type doped GaN layer (30) to form the patterned p-type doped GaN layer (35). In this example, the first metal layer (40) is TiN and the partially patterned second metal layer (54) is W. A silicon nitride hard mask (70) is present on the partially patterned second metal layer. This cross-section image corresponds to the schematic drawing presented in FIG. 6. Observing the bi-layer, it is observed that the second metal layer (50) has been etched (54) of about 37 nm to 42 nm from lateral sides (FIG. 18)

This second dry etching process may, in embodiments, comprise 2 sub-etching processes.

The first sub-etching process does not selectively etch the p-type doped GaN layer with respect to the layer having the surface (25) (FIG. 3) of the layer stack (20) and thus, which is adjacent to the p-type doped GaN layer. As a result, this first sub-etching process is performed to obtain only a partial etching of the p-type doped GaN layer. In embodiment, this first sub-etch process results in etching the p-type doped GaN layer (30) down to at least half of its thickness. In further embodiments, this partial etching may be down to more than half of its thickness. In embodiments, an etch mixture of $BCl_3/Cl_2$ may be used in this first sub-etching process.

In the second sub-etching process, a dry etch chemistry, different from the one used in the first sub-etching process, may be used, thereby etching the remaining thickness of the p-type doped GaN layer thus, stopping on the surface (25) of the layer stack (20). This dry etch chemistry used in the second sub-etching process may selectively etch the p-type doped GaN layer with respect to the layer having the surface (25) (FIG. 3a). This dry etch chemistry may be a mixture of $BCl_3/SF_6$.

In embodiments, this surface (25) may be the surface of the barrier layer provided in the layer stack (20). Thus, the second sub-etching process stops on the barrier layer.

In embodiments, the second dry etching process (302) may be followed by a cleaning process to get rid of dry etch residues.

Following this, in embodiments, the patterning process may further comprise performing a wet etch process (303) (FIG. 2), thereby forming the patterned bi-layer (65) (FIG. 7). This wet etch process results in lateral etching of the first layer (40) faster than that of the second metal layer (50).

Figure 19:
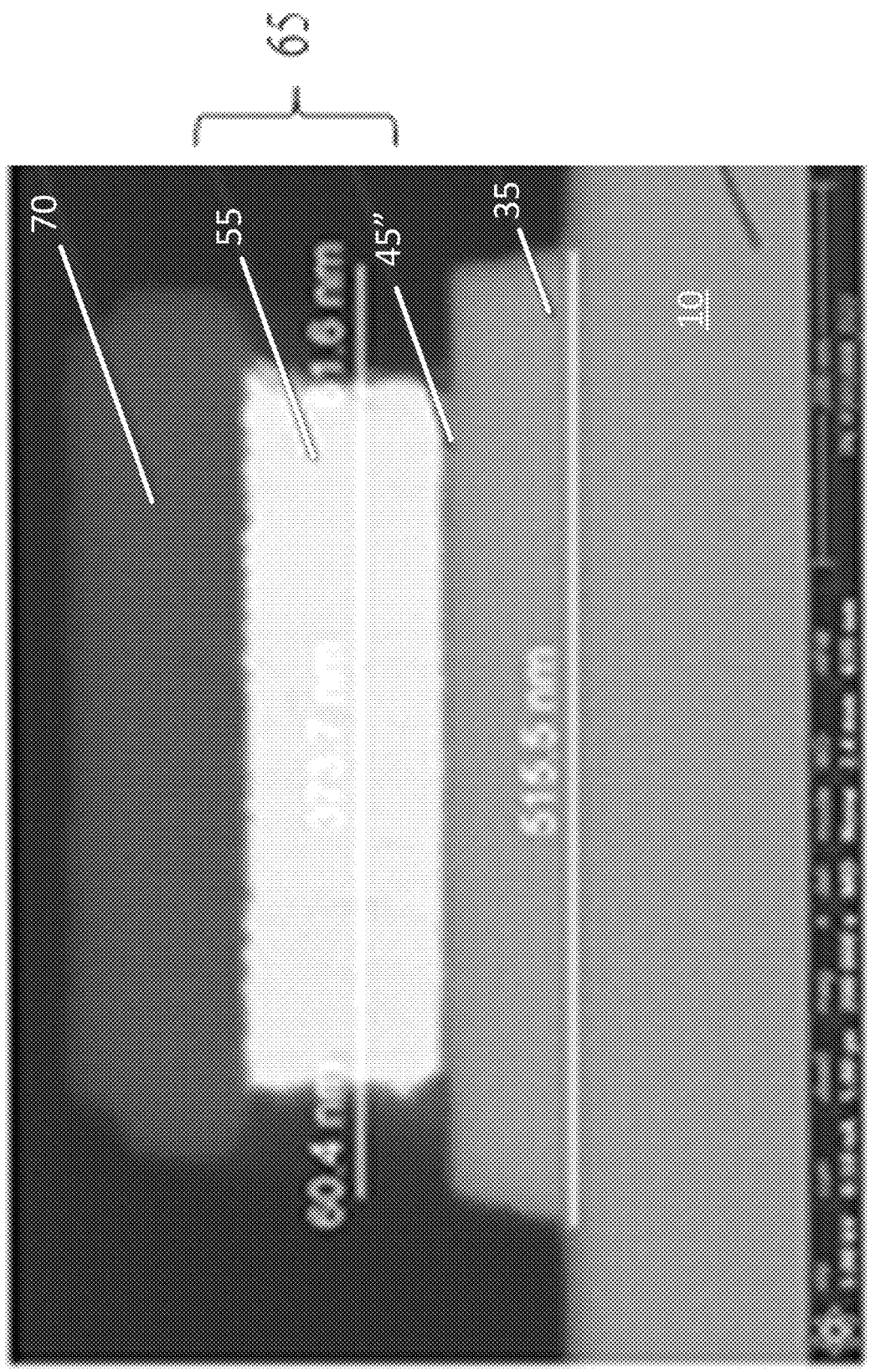
FIG. 19 is a cross sectional scanning electron microscopy (X-SEM) image of a semiconductor structure, according to an example.
Figure 20:
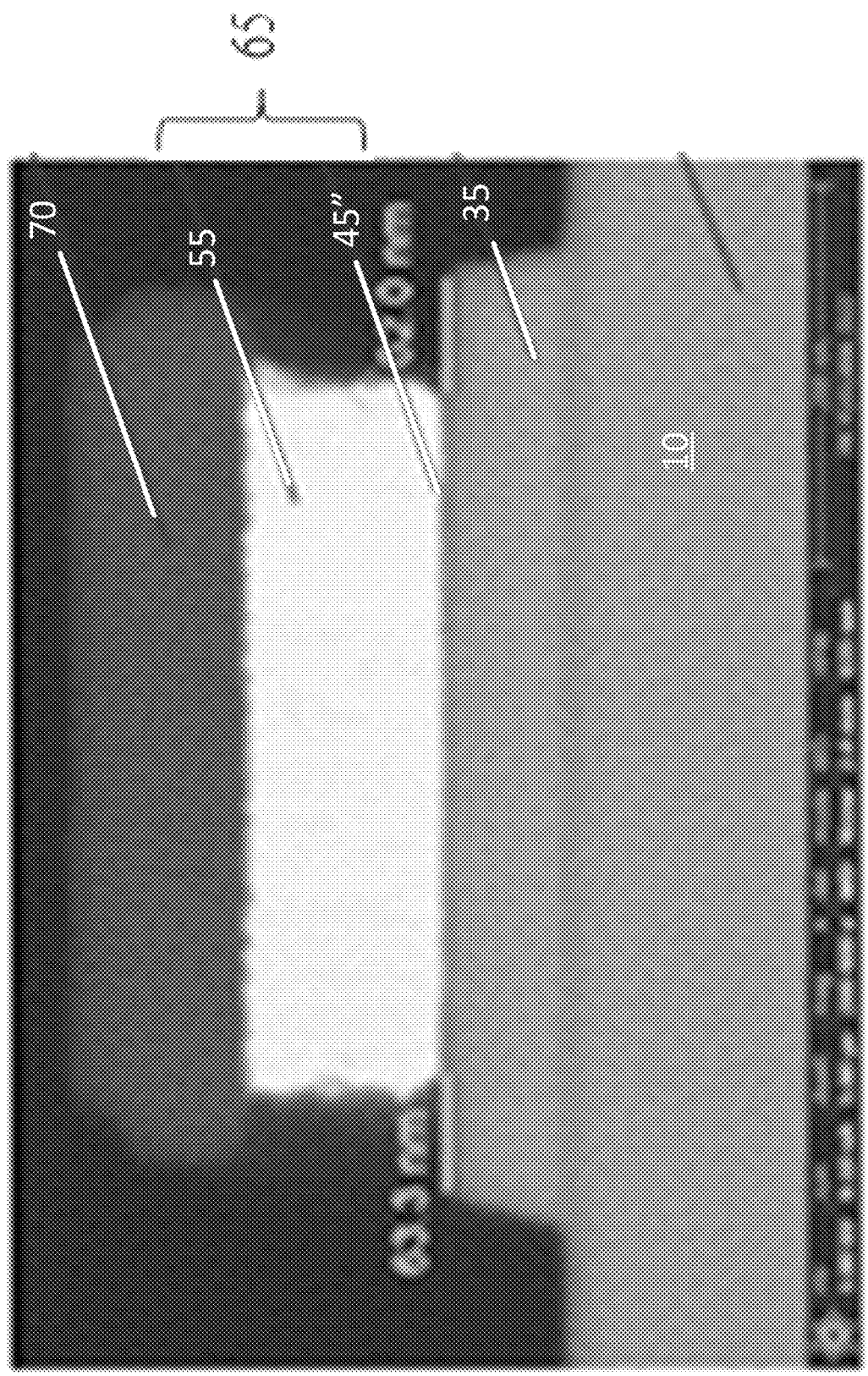
FIG. 20 is a cross sectional scanning electron microscopy (X-SEM) image of a semiconductor structure, according to an example.

FIG. 19 and FIG. 20 show a cross-section SEM image of the semiconductor structure (500) after this wet etching process (303) has been completed, where the patterning of the bi-layer is completed resulting in the patterned bi-layer (65). This cross-section image corresponds to the schematic drawing presented in FIG. 7. In this example, the first metal layer (40), which is shown to be patterned (45"), is TiN, and the patterned second metal layer (55) is W. Observing the patterned bi-layer (65), it is observed that the periphery of the partially patterned first metal layer (45") and that of the partially patterned second metal layer (55) are aligned. This is due to the fact that during this wet etching process (303), the partially patterned first metal layer (45) is etched to a greater extent than the partially patterned second metal layer (54), at the end of which its periphery aligns with that of the patterned second metal layer (55). Besides, during this wet etching process (303), the partially patterned first metal layer (45) is etched both laterally from the sides, as well as vertically from the top as these portions are exposed to the wet etch chemistry. This is potentially advantageous in order to provide the alignment of the peripheries (41; 51) at the end of this wet etching process. Etch rate calculations based on the comparison given in FIG. 18 and FIG. 20 indicate that the lateral etching of 63 nm of TiN in 15 minutes corresponded to an etch rate of TiN of 4.2 nm/min. Etch rate calculations based on the comparison given in FIG. 18 and FIG. 19 indicate that the difference in lateral etching of 60.4 nm (FIG. 18) vs. 37.2 nm (FIG. 19) of W in 15 minutes corresponded to an etch rate of W of 1.55 nm/minutes during this wet etching process (303). This indicates clearly that this wet etching process has the potential advantage of retracting the first metal layer (40) more than the second metal layer (55) so that its periphery is aligned with that of the second metal layer.

Thus, in embodiments, the wet etching process may be configured such that the first metal layer (40) has a higher etch rate than the second metal layer (50) so that the periphery (41) of the patterned first metal layer (45″) may be aligned to the periphery (51) of the patterned second metal layer (55) (FIG. 7). This has the potential advantage that the profile of the patterned first metal layer (45″) and that of the patterned second metal layer (55) can be tailored. While a profile such as for example shown in FIG. 16 would provide reduced total gate metal resistance, a profile such as for example shown in FIG. 17 might compromise slightly with the total gate metal resistance while still providing ease of deposition of further layers.

In embodiments, where the first metal layer (40) is titanium nitride (TiN) and the second metal layer (50) is tungsten (W), this wet etch process may be performed by subjecting the semiconductor structure (500) to a wet-etch mixture comprising $H_2SO_4$ and $H_2O_2$, known as sulfuric peroxide mixture (SPM) in the art. The temperature of this wet-etch solution during this wet etch process is kept in the range of 60° C. to 95° C. In order to provide a constant wet-etch solution temperature throughout the wet-etching process, a temperature control unit equipped with a temperature sensor, a controller, and a heater can be employed. The etch rate of W and TiN against this wet etch chemistry may be subject to change as a function of temperature within this range and as a function of etch time. While the etch rate may decrease towards the lower end of this temperature range, etching may become more aggressive towards the higher end. In embodiments, the temperature of the wet etch solution may be kept at 90° C.

In embodiments, this wet-etch chemistry consists of $H_2SO_4$ and $H_2O_2$, arranged in a volume ratio of 10:1 respectively and the wet etching process may comprise subjecting the semiconductor structure to this wet etch chemistry at 90° C.

Thus, by configuring the temperature of this wet-etch solution and the etching time, one can adjust the profile of the patterned first metal layer (40) and patterned second metal layer (50). Adjusting the profile of the patterned first metal layer (40) and patterned second metal layer (50) may refer to the alignment of their peripheries.

In embodiments, where the first metal layer (40) may be tantalum nitride (TaN) and the second metal layer (50) may be tungsten (W), this wet etch process may be performed by subjecting the semiconductor structure (500) to a wet-etch mixture comprising $NH_4OH$ and $H_2O_2$, known as ammonia peroxide mixture (APM) in the art. The temperature of this wet-etch solution during this wet etch process may be kept at a temperature in the range of 25° C. to 70° C. In embodiments, the temperature of the wet etch solution may be kept at 65° C. In embodiments, where APM is used in case the first metal layer (40) may be tantalum nitride (TaN), this APM wet-etch chemistry may be arranged with 1:4:20 volume ratio of $NH_4OH$—$H_2O_2$— de-ionized water (DIW).

In a second aspect, the disclosure relates to an intermediate semiconductor structure (550) for the manufacturing of an III-Nitride enhancement mode HEMT device. We now refer to FIG. 7. The intermediate semiconductor structure comprises a substrate (10). In embodiments, this semiconductor substrate (10) may comprise a monocrystalline silicon layer. This monocrystalline silicon layer may be a Si (111) or a Si (100) layer. A layer stack (20) having a surface (25) overlies the substrate (10). Each layer of the layer stack (20) comprises a Group III-nitride material.

In embodiments, this layer stack (20) may comprise a layer of AlN for nucleation of the layer stack (20) on the substrate (10). On such a nucleation layer, a buffer layer may be provided, which overlies the substrate (10). A channel layer may be provided on the buffer layer, which may then be topped up on the channel layer, with a barrier layer (not shown in the figures) as known to persons skilled in the art. Thus, the surface (25) of the layer stack (20) may, in embodiments, be comprised in the barrier layer and thus be the surface of the barrier layer. A patterned p-type doped GaN layer (35) is present on the surface (25). This patterned p-type doped GaN layer has a second horizontal cross section (36). A patterned metal bi-layer (65) for forming a Schottky junction is present on the patterned p-type doped GaN layer (35). This patterned bi-layer (65) has a first horizontal cross section (66) and consists of a first patterned metal layer (45″) being in contact with the patterned p-type doped GaN layer (35) and being sandwiched between the patterned p-type doped GaN layer (35) and a second patterned metal layer (55) having a lower sheet resistance than the first patterned metal layer (45″). A periphery (41) of the first patterned metal layer (45″) is aligned to a periphery (51) of the second patterned metal layer (55) and the second horizontal cross section (36) has a larger area than the first horizontal cross section (66).

Such an intermediate semiconductor structure (500) for the manufacturing of a III-nitride enhancement mode HEMT device is potentially advantageous due to the fact that it provides ease of manufacturing. This is thanks to the fact that the periphery (41) of the first patterned metal layer (45″) is aligned to a periphery (51) of the second patterned metal layer (55), thereby allowing easy deposition of further layers without leading to the presence of gaps or voids in the final e-mode HEMT device. Such further layers may for example involve the deposition of dielectric layers such as for instance, aluminum oxide, silicon oxide, or silicon nitride and metal layers needed to make the contacts. Presence of such so-called gaps or voids cause problems such as device to device variation, which consequently lowers the yield should, for example, the periphery (41) of the first patterned metal layer (45″) not be aligned to a periphery (51) of the second patterned metal layer (55).

In addition to the ease of manufacturing provided by such an intermediate semiconductor structure, the presence of the second patterned metal layer (55) having a lower sheet resistance than the first patterned metal layer (45″) provides for the reduced total gate metal sheet resistance, thus, leading to a reduced total gate metal resistance, while maintaining device characteristics such as threshold voltage ($V_t$) and gate current in on-state ($I_{g\text{-}on}$), where ($V_{gs} > V_t$) is maintained. This then typically allows for gate length scaling. Allowing for gate length scaling enables area scaling of the device.

In embodiments, the first horizontal cross section (66) may substantially be the same at every position between the patterned p-type doped GaN layer (35) to a surface of the patterned bi-layer (65) such as shown for instance in FIG. 16. This has the potential advantage that not only the provision of further layers on the semiconductor structure (500) is made easier in the manufacturing of an e-mode HEMT device when this intermediate semiconductor structure is used but also the presence of the second metal layer (50) generally results in a decrease in the total gate resistance since the horizontal cross section is kept the same.

In embodiments, the thickness of the second patterned metal layer (55) may be in the range of 50 nm to 500 nm. This offers the potential advantage that a reduced total gate metal resistance is obtained when this intermediate semiconductor structure is used for the manufacturing of the e-mode HEMT device. This has to do with the reduction in the total gate metal sheet resistance offered by this second patterned metal layer (55) in this thickness range. Thickness values greater than 500 nm can pose challenges on the process regarding the deposition of further layers on the semiconductor structure for the manufacturing of the e-mode HEMT device. Furthermore, semiconductor structures having a thickness of the patterned second metal layer (55) higher than 500 nm run the risk of having wafer bow, which makes it difficult in terms of tool handling and process control if, for example, the wafer bow would be higher than 50 micrometers. On the other hand, thickness values lower than 50 nm can result in an undesirable increase in total gate metal sheet resistance since sheet resistance is inversely proportional to thickness. As such, it can lead to undesirable total gate metal resistance increase.

In embodiments, the thickness of the second patterned metal layer (55) may be in the range of 80 nm to 120 nm.

In embodiments, the first metal layer (40) may be titanium nitride (TiN) and the second metal layer (50) may be tungsten (W) in this intermediate semiconductor structure.

In alternative embodiments, the second metal layer (50) may be aluminum. This can be potentially advantageous since aluminum also has a lower sheet resistance than TiN, and thus it can contribute to the reduction in the total gate metal sheet resistance, potentially leading to a reduction in the total gate metal resistance.

In alternative embodiments, while the first metal layer (40) may be tantalum nitride (TaN), the second metal layer (50) may be tungsten (W). Choice of TaN offers also the potential advantage that it creates a Schottky junction with the p-type doped GaN layer (30). In these embodiments, the work function of TaN is similar to that of TiN, so that TaN can be a potential candidate for the first metal layer (40). In these embodiments, TaN may be provided at a thickness of 1 nm to 2 nm.

In still alternative embodiments, while the first metal layer (40) may be a bilayer, the second metal layer (50) may be tungsten (W). This bilayer may be a bilayer of TiN/TaN. In these embodiments, TaN may be provided in contact with the p-type doped GaN layer (30). In these embodiments, while TaN may be provided at a thickness of 1 nm to 2 nm, TiN may be provided at a thickness of 3 nm to 5 nm.

When this intermediate semiconductor structure is used for the manufacturing of an III-nitride e-mode HEMT device, further process steps are realized including dielectric deposition such as aluminum oxide, silicon oxide, or silicon nitride. This may be followed by formation of source/drain contact opening. This may then be followed by ohmic metal deposition, patterning, and annealing. Back-end processing may include dielectric layer deposition and patterning and metal deposition and patterning.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method comprising:
    providing a semiconductor structure comprising:
        a substrate;
        a layer stack, wherein each layer of the layer stack comprises a Group III-nitride material; and
        a p-type doped GaN layer on the layer stack;
    providing, on the p-type doped GaN layer, a metal bi-layer, thereby forming a Schottky junction with the p-type doped GaN layer, the metal bi-layer comprising a first metal layer in contact with the p-type doped GaN layer and a second metal layer on the first metal layer and having a lower sheet resistance than the first metal layer; and
    performing a patterning process upon the metal bi-layer and the p-type doped GaN layer such that a first periphery of the first metal layer is aligned to a second periphery of the second metal layer and such that a first cross section of the metal bi-layer is smaller than a second cross section of the p-type doped GaN layer parallel to the first cross section, wherein performing the patterning process comprises:
    performing a first dry etching process using a first dry etch chemistry, thereby partially patterning the metal bi-layer, wherein a first etch rate of the first metal layer is less than a second etch rate of the second metal layer;
    performing a second dry etching process using a second dry etch chemistry different from the first dry etch chemistry, thereby patterning the p-type doped GaN layer; and
    performing a wet etching process upon the metal bi-layer.

2. The method according to claim 1, wherein the first cross section is substantially the same at every position between the p-type doped GaN layer and a surface of the metal bi-layer opposite the p-type doped GaN layer.

3. The method according to claim 1, wherein a thickness of the second metal layer is within a range of 50 nm to 500 nm.

4. The method according to claim 1, wherein the first metal layer comprises TiN and the second metal layer comprises W.

5. The method according to claim 1, wherein the wet etching process is configured such that the first metal layer has a greater etch rate than the second metal layer so that the first periphery is aligned to the second periphery.

6. The method according to claim 1, wherein the wet etching process comprises subjecting, at a temperature in a range of 60° C.-95° C., the semiconductor structure to a chemistry comprising $H_2SO_4$ and $H_2O_2$.

7. The method according to claim 1, wherein the first dry etch chemistry comprises $CHF_3$ and $SF_6$.

8. The method according to claim 1, wherein performing the second dry etching process comprises:
    performing a third dry etching process using a third dry etch chemistry, thereby non-selectively etching the p-type doped GaN layer with respect to a layer beneath the p-type doped GaN layer, and
    performing a fourth dry etching process using a fourth dry etch chemistry different from the third dry etch chemistry, thereby selectively etching the p-type doped GaN layer with respect to the layer beneath the p-type doped GaN layer.

9. The method according to claim 1, wherein the layer stack comprises:
   a buffer layer overlying the substrate;
   a channel layer on the buffer layer; and
   a barrier layer on the channel layer, wherein a surface of the layer stack is comprised in the barrier layer.

10. The method according to claim 1, wherein a thickness of the second metal layer is within a range of 80 nm to 120 nm.

11. The method according to claim 1, wherein the first metal layer comprises a third metal layer comprising TiN and a fourth metal layer comprising TaN.

12. The method according to claim 11, wherein the second metal layer comprises W.

13. The semiconductor structure method according to claim 11, wherein the fourth metal layer contacts the p-type doped GaN layer.

14. The method according to claim 11, wherein the fourth metal layer has a thickness within a range of 1 nm to 2 nm.

* * * * *